US012800669B2

(12) United States Patent
Li et al.

(10) Patent No.: US 12,800,669 B2
(45) Date of Patent: Nov. 17, 2026

(54) BATTERY TESTING APPARATUS AND DEVICE

(71) Applicant: CONTEMPORARY AMPEREX TECHNOLOGY (HONG KONG) LIMITED, Hong Kong (CN)

(72) Inventors: Haiyang Li, Ningde (CN); Lixin Guo, Ningde (CN); Shaoteng Ren, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 702 days.

(21) Appl. No.: 18/228,979

(22) Filed: Aug. 1, 2023

(65) Prior Publication Data

US 2024/0219474 A1 Jul. 4, 2024

Related U.S. Application Data

(63) Continuation of application No. PCT/CN2023/085206, filed on Mar. 30, 2023.

(30) Foreign Application Priority Data

Dec. 30, 2022 (CN) ......................... 202223601277.9

(51) Int. Cl.
*H02J 7/00* (2026.01)
*G01R 31/387* (2019.01)
(Continued)

(52) U.S. Cl.
CPC .............. *G01R 31/387* (2019.01); *H02J 7/44* (2026.01); *H02J 7/825* (2026.01); *H02J 7/94* (2026.01)

(58) Field of Classification Search
USPC ......................................................... 320/109
See application file for complete search history.

(56) References Cited

U.S. PATENT DOCUMENTS

2014/0055143 A1 2/2014 Shieh et al.
2016/0211494 A1* 7/2016 Kurosu .............. H01M 10/425
(Continued)

FOREIGN PATENT DOCUMENTS

CA 3187293 A1 12/2022
CN 203658549 U 6/2014
(Continued)

OTHER PUBLICATIONS

Machine Translation of CN2042230948U (Year: 2015).*
(Continued)

*Primary Examiner* — Samuel Berhanu
(74) *Attorney, Agent, or Firm* — ANOVA LAW GROUP, PLLC

(57) ABSTRACT

A battery testing apparatus includes an energy storage battery pack, a control module, a DC bus, and a DCDC converter. The control module sends a charging/discharging control instruction to the DCDC converter, and the DCDC converter transfers power between a battery under test connected to an output terminal and the energy storage battery pack through the DC bus upon receiving the charging/discharging control instruction, to perform charge/discharge testing on the battery under test connected to the output terminal.

12 Claims, 2 Drawing Sheets

(51) Int. Cl.

| | |
|---|---|
| ***H02J 7/44*** | (2026.01) |
| ***H02J 7/82*** | (2026.01) |
| ***H02J 7/94*** | (2026.01) |

(56) References Cited

U.S. PATENT DOCUMENTS

| | | | | |
|---|---|---|---|---|
| 2017/0317501 | A1* | 11/2017 | Moriyama .............. | H02J 3/381 |
| 2021/0359527 | A1 | 11/2021 | Taylor et al. | |
| 2022/0115901 | A1 | 4/2022 | Welkin et al. | |
| 2023/0031352 | A1* | 2/2023 | Yan .......................... | H02J 7/865 |

FOREIGN PATENT DOCUMENTS

| | | | |
|---|---|---|---|
| CN | 204230948 | U | 3/2015 |
| CN | 110850294 | A | 2/2020 |
| CN | 111064254 | A | 4/2020 |
| CN | 114475339 | A | 5/2022 |
| CN | 217739415 | U | 11/2022 |
| WO | 2023171799 | A1 | 9/2023 |

OTHER PUBLICATIONS

The World Intellectual Property Organization (WIPO) International Search Report for PCT/CN2023/085206 May 23, 2023 6 pages (English translation included).

The European Patent Office (EPO) The Extended European Search Report for Application No. 23736223.1 Sep. 30, 2024 9 Pages.

* cited by examiner

BATTERY TESTING APPARATUS AND DEVICE

CROSS-REFERENCE TO RELATED APPLICATIONS

This application is a continuation of International Application No. PCT/CN2023/085206, filed on Mar. 30, 2023, which claims priority to Chinese Patent Application No. 202223601277.9, filed on Dec. 30, 2022, which are incorporated herein by reference in their entirety.

TECHNICAL FIELD

This application relates to the field of battery testing technologies, and specifically to a battery testing apparatus and device.

BACKGROUND

Electric vehicles, electric aircraft, and other electric devices all need batteries. Batteries are vital to the safe operation of electric devices and therefore need to be tested before battery installation to determine whether the batteries meet the assembly requirements. The current battery testing apparatus has large power loss during the battery testing process, resulting in a low energy utilization rate of the battery testing apparatus.

SUMMARY

This application proposes a battery testing apparatus and device, to solve the technical problem of large power loss during the charge testing and discharge testing processes of the battery under test.

According to a first aspect, this application provides a battery testing apparatus including:

an energy storage battery pack, the energy storage battery pack having an input/output terminal connected to a DC bus;

at least one DCDC converter, each DCDC converter having an input terminal connected to the DC bus and having an output terminal connected to a battery under test; and a control module, connected to the energy storage battery pack and each DCDC converter; where the control module is configured to send a charging/discharging control instruction to the DCDC converter; and the DCDC converter is configured to transfer power between the battery under test connected to the output terminal and the energy storage battery pack through the DC bus upon receiving the charging/discharging control instruction, to perform charge/discharge testing on the battery under test connected to the output terminal.

In embodiments of the first aspect, the energy storage battery pack is used for charge and discharge testing on the battery under test connected to the output terminal of the DCDC converter, without obtaining power from a power grid to charge the battery under test and without feeding back power released from the battery under test to the power grid. This reduces the loss incurred during the transmission of power and increases the energy utilization efficiency of the battery testing apparatus.

In some embodiments, the battery testing apparatus further includes:

an ACDC converter, the ACDC converter having an input terminal for connecting to a power grid, having an output terminal connected to the input/output terminal of the energy storage battery pack, and having a controlled terminal connected to the control module; where the control module is further configured to send a power supplement control instruction to the ACDC converter; and the ACDC converter is configured to: upon receiving the power supplement control instruction, switch to an operating state to obtain power from the power grid to charge the energy storage battery pack.

The DCDC converter has power loss in the process of charging or discharging the battery under test, and therefore the power level of the energy storage battery pack gradually decreases and cannot meet the charging demand of the battery under test. Considering this, this embodiment proposes the battery testing apparatus including the ACDC converter. The control module sends a power supplement control instruction to the ACDC converter to make the ACDC converter obtain power from the power grid to charge the energy storage battery pack. This improves the operation stability of the battery testing apparatus without setting up a large-capacity energy storage battery pack.

In some embodiments, the control module is further configured to send a parallel charging control instruction to the ACDC converter.

The ACDC converter is further configured to: upon receiving the parallel charging control instruction switch to an operating state to obtain power from the power grid, so as to provide power for the battery under test for charge testing through the DC bus together with the energy storage battery pack.

In situations where multiple batteries need to be charged simultaneously during charge testing on the batteries under test, the energy storage battery pack may not be able to meet the demand of charging the multiple batteries simultaneously. Considering this, this embodiment uses the control module to send the parallel charging control instruction to the ACDC converter such that the ACDC converter switches to the operating state to provide power to the battery under test through the DC bus together with the energy storage battery pack. In this way, when the energy storage battery pack cannot meet the charge testing requirements of the battery under test, the ACDC converter is used to obtain power from the power grid to provide power for the battery under test together with the energy storage battery pack, allowing the battery testing apparatus to still meet the charge testing requirements without setting up a large-capacity energy storage battery pack. This makes the battery testing apparatus more widely applicable while reducing the cost of the energy storage battery pack.

In some embodiments, the control module is further configured to send a power feedback control instruction to the ACDC converter.

The ACDC converter is further configured to switch to an operating state upon receiving the power feedback control instruction, to feed back to the power grid the power released from the battery under test during discharge testing.

In situations where multiple batteries are discharged simultaneously during the charging test on the batteries under test, the energy storage battery pack may not be able to store all power. Considering this, this embodiment uses the control module to send a power feedback control instruction to the ACDC converter such that the ACDC converter switches to the operating state to feed back to the power grid the power that cannot be stored by the energy storage battery pack. This can ensure that the energy storage battery pack is not damaged, improving the safety of the power grid testing apparatus.

In some embodiments, the control module is further configured to send a switching-out control instruction to the ACDC converter.

The ACDC converter is further configured to switch to a non-operating state upon receiving the switching-out control instruction.

When the ACDC converter is always in an operating state, power exchange between the battery testing apparatus and the power grid may increase power loss of the battery testing apparatus. Considering this, this embodiment uses the control module to send the switching-out control instruction to the ACDC converter such that the ACDC converter switches to the non-operating state. This enables the ACDC converter to switch to the non-operating state after the energy storage battery pack survives extreme conditions, stopping power exchange between the battery testing apparatus and the power grid, further reducing the power loss of the battery testing apparatus.

In some embodiments, the battery capacity of the energy storage battery pack is average demanded power for charge testing on all batteries under test.

In this embodiment, the battery capacity of the energy storage battery pack is set to the average demanded power of all batteries under test to reduce the cost of the energy storage battery pack while ensuring that the energy storage battery pack meets charge testing requirements of all batteries under test.

In some embodiments, the battery capacity of the energy storage battery pack is a sum of battery capacities of all batteries under test.

In this embodiment, the battery capacity of the energy storage battery pack is set to the sum of the battery capacities of all the batteries under test, enabling the energy storage battery pack to meet the charge testing requirements of all the batteries under test.

In some embodiments, a power feedback route between the battery testing apparatus and the power grid is a disconnected state when the ACDC converter is in a non-operating state.

In this embodiment, when the ACDC converter is in the non-operating state, the power feedback route between the battery testing apparatus and the power grid is in the disconnected state, preventing power exchange between the power grid and the battery testing apparatus via the power feedback route, reducing power loss.

In some embodiments, a power feedback route between the battery testing apparatus and the power grid is in a connected state when the ACDC converter is in an operating state.

In this embodiment, when the ACDC converter is in the operating state, the power feedback route between the battery testing apparatus and the power grid is in the connected state, enabling power exchange with the power grid when the energy storage battery pack is in an extreme condition, broadening applicable scenarios of the battery testing apparatus.

In some embodiments, the control module is further configured to obtain remaining power of the energy storage battery pack, and when the remaining power is less than or equal to a first preset power threshold, send a power supplement control instruction to the ACDC converter.

In this embodiment, when the remaining power of the energy storage battery pack is less than or equal to the first preset power threshold, the control module sends the power supplement control instruction to the ACDC converter, to make the ACDC converter obtain power from the power grid to charge the energy storage battery pack, ensuring the operation stability of the battery testing apparatus without setting up a large-capacity energy storage battery pack.

In some embodiments, the control module is further configured to predict total charging demanded power of all batteries under test according to a charge testing process of each battery under test, and when the total charging demanded power is greater than total power released from the energy storage battery pack, send a parallel charging instruction to the ACDC converter.

In this embodiment, under a condition that the total charging demanded power of the batteries under test is greater than the total power released from the energy storage battery pack, the ACDC converter obtains power from the power grid to charge the battery under test together with the energy storage battery pack. In this way, the battery testing apparatus can still meet the charge testing requirements under a condition that no large-capacity energy storage battery pack is set up, making the battery testing apparatus more widely applicable while reducing the cost of the energy storage battery pack.

In some embodiments, the control module is further configured to predict total released power of all batteries under test according to a discharge testing process of each battery under test, and when the total released power is greater than an energy storage capacity of the energy storage battery pack, send a power feedback control instruction to the ACDC converter.

In this embodiment, when the total power released from the batteries under test is greater than the energy storage capacity of the energy storage battery pack, the power feedback control instruction is sent to the ACDC converter to make the ACDC converter switch to the operating state to feed back to the power grid the power that cannot be stored in the energy storage battery pack. This reduces the probability of damage to the energy storage battery pack and improves the safety of the power grid testing apparatus while meeting the discharge testing requirements.

According to a second aspect, this application further proposes a battery testing device. The battery testing device includes the battery testing apparatus as described above.

The foregoing description is merely an overview of the technical solution of this application. For a better understanding of the technical means in this application such that they can be implemented according to the content of the specification, and to make the above and other objectives, features, and advantages of this application more obvious and easier to understand, the following describes specific embodiments of this application.

BRIEF DESCRIPTION OF DRAWINGS

To describe the technical solutions in embodiments of this application more clearly, the following briefly describes the accompanying drawings required for describing the embodiments. Apparently, the accompanying drawings in the following description show merely some of the embodiments of this application, and persons of ordinary skill in the art may still derive other drawings from structures shown in these accompanying drawings without creative efforts.

Figure 1:
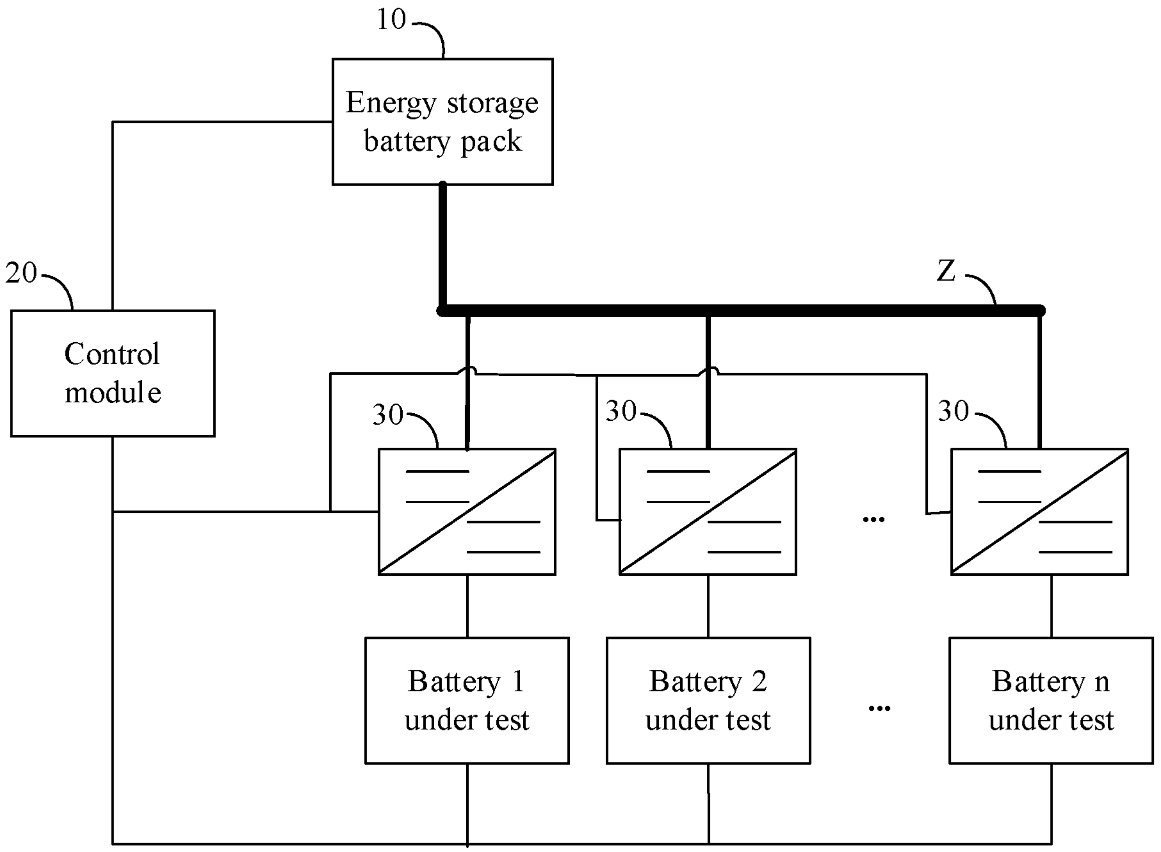
FIG. 1 a functional module diagram of an embodiment of a battery testing apparatus according to this application.

Reference signs in the accompanying drawings are illustrated as follows:

| Sign | Name | Sign | Name |
|---|---|---|---|
| 10. | energy storage battery pack; | 20. | control module; |
| 30. | DCDC converter; | Z | DC bus |
| 40. | ACDC converter | | |

The purpose, functional features, and advantages of this application are further explained with reference to the accompanying drawings in conjunction with the embodiments.

DESCRIPTION OF EMBODIMENTS

The following describes in detail the embodiments of technical solutions of this application with reference to the accompanying drawings. The following embodiments are merely intended for a clearer description of the technical solutions of this application and therefore are used as just examples which do not constitute any limitations on the protection scope of this application.

Unless otherwise defined, all technical and scientific terms used herein shall have the same meanings as commonly understood by those skilled in the art to which this application relates. The terms used herein are intended to merely describe the specific embodiments rather than to limit this application. The terms "include", "comprise", and "have" and any other variations thereof in the specification, claims and brief description of drawings of this application are intended to cover non-exclusive inclusions.

In the description of the embodiments of this application, the terms "first", "second" and the like are merely intended to distinguish between different objects, and shall not be understood as any indication or implication of relative importance or any implicit indication of the number, sequence or primary-secondary relationship of the technical features indicated. In the description of this application, "a plurality of" means at least two unless otherwise specifically stated.

In this specification, reference to "embodiment" means that specific features, structures or characteristics described with reference to the embodiment may be incorporated in at least one embodiment of this application. The word "embodiment" appearing in various places in the specification does not necessarily refer to the same embodiment or an independent or alternative embodiment that is exclusive of other embodiments. It is explicitly or implicitly understood by persons skilled in the art that the embodiments described herein may be combined with other embodiments.

In the description of the embodiments of this application, the term "and/or" is only an associative relationship for describing associated objects, indicating that three relationships may be present. For example, A and/or B may indicate the following three cases: presence of only A, presence of both A and B, and presence of only B. In addition, the character "/" in this specification generally indicates an "or" relationship between contextually associated objects.

In the description of the embodiments of this application, the term "a plurality of" means more than two (inclusive). Similarly, "a plurality of groups" means more than two (inclusive) groups, and "a plurality of pieces" means more than two (inclusive) pieces.

In the description of the embodiments of this application, the orientations or positional relationships indicated by the technical terms "center", "longitudinal", "transverse", "length", "width", "thickness", "upper", "lower", "front", "rear", "left", "right", "perpendicular", "horizontal", "top", "bottom", "inside", "outside", "clockwise", "counterclockwise", "axial", "radial", "circumferential", and the like are based on the orientations or positional relationships as shown in the accompanying drawings. These terms are merely for ease and brevity of description of the embodiments of this application rather than indicating or implying that the apparatuses or components mentioned must have specific orientations or must be constructed or manipulated according to specific orientations, and therefore shall not be construed as any limitations on embodiments of this application.

In the description of the embodiments of this application, unless otherwise specified and defined explicitly, the terms "mount", "connect", "join", and "fasten" should be understood in their general senses. For example, they may refer to a fixed connection, a detachable connection, or an integral connection, may refer to a mechanical connection or electrical connection, and may refer to a direct connection, an indirect connection via an intermediate medium, or an interaction between two elements. Persons of ordinary skill in the art can understand specific meanings of these terms in this application as appropriate to specific situations.

Currently, from a perspective of the market development, application of traction batteries is being more extensive. Traction batteries have been not only used in energy storage power supply systems such as hydroelectric power plants, thermal power plants, wind power plants, and solar power plants, but also widely used in many other fields including electric transportation tools such as electric bicycles, electric motorcycles, and electric vehicles, military equipment, and aerospace. With continuous expansion of application fields of traction batteries, market demands for traction batteries are also expanding, and the safety requirements for batteries are also increasing. Therefore, charge and discharge testing needs to be performed on the battery before the battery is assembled.

At present, when charge and discharge testing is performed on the battery, a first-level DC bus and a feedback route are set up. To charge the battery, the ACDC converter is controlled to take power from the power grid through the first-level DC bus and deliver the power to a second-level DC bus, from which the DCDC converter obtains the power to charge the battery. When the battery is discharged, released power is fed back to the power grid through the feedback route. Both the first-level DC bus that takes power from the power grid and the feedback route that feeds back power to the power grid cause power loss during power transmission, resulting in low power utilization efficiency of the testing apparatus.

Based on this, embodiments of this application propose a battery testing apparatus. An energy storage battery pack is set in the battery testing apparatus to provide charging and discharging support for a battery under test. Therefore, during charge and discharge testing on the battery under test, it is not necessary to obtain power from the power grid to charge the battery under test or to feed back to the power grid the power released from the battery under test. This reduces the loss in the process of power transmission and improves the power utilization efficiency of the battery testing apparatus.

In some embodiments of this application, referring to FIG. 1, this application provides a battery testing apparatus including an energy storage battery pack 10, a control module 20, a DC bus Z, and at least one DCDC converter. The energy storage battery pack 10 has an input/output terminal connected to the DC bus Z. Each DCDC converter has an input terminal connected to the DC bus Z and has an output terminal connected to the battery under test. The control module 20 is connected to the energy storage battery pack 10 and each DCDC converter.

The control module 20 sends a charging/discharging control instruction to the DCDC converter 30, and the DCDC converter 30 transfers power between the battery under test connected to the output terminal and the energy storage battery pack 10 through the DC bus upon receiving the charging/discharging control instruction, to perform charge/discharge testing on the battery under test connected to the output terminal.

The charging/discharging control instruction may be an instruction from the control module to control the DCDC converter to perform charge/discharge testing on the battery under test connected to the output terminal. The control module can send the charging/discharging control instruction to the DCDC converter upon receiving an external charging/discharging operation, or the control module can send the charging/discharging control instruction to the DCDC converter according to a preset charge/discharge testing parameter or send the charging/discharging control instruction to the DCDC converter in another way, which is not limited in this embodiment. The charging/discharging control instruction includes a charging control instruction and a discharging control instruction. The charging control instruction can be an instruction to control the DCDC converter to perform charge testing on the battery under test connected to the output terminal. The discharging control instruction can be an instruction to control the DCDC converter to perform discharge testing on the battery under test connected to the output terminal.

The energy storage battery pack 10 may be a battery pack obtained by connecting a number of battery cells in series or in parallel. The DCDC converter 30 may be a voltage converter that transforms an input voltage and effectively outputs a fixed voltage. The input and output ports of the energy storage battery pack 10 are the same port. When the energy storage battery pack 10 outputs power, the port can be referred to as the output port. When the energy storage battery pack 10 stores power, the port can be referred to as the input port. When charge testing is performed on the battery under test, the energy storage battery pack 10 outputs power through the DC bus Z to the battery under test connected to the output terminal of the DCDC converter 30. When discharge testing is performed on the battery under test, the energy storage battery pack 10 receives power released from the battery under test connected to the output terminal of the DCDC converter, through the DC bus Z, and stores the released power received. The battery under test can be a battery that needs charge or discharge testing.

In this embodiment, the battery pack power supply bus (also called DC bus) is established for the energy storage battery pack 10 to input power to the DCDC converter 30. The control module 20 sends a charging control instruction to the DCDC converter 30, and upon receiving the charging control instruction, the DCDC converter 30 obtains power from the energy storage battery pack through the DC bus to perform charge testing on the battery under test connected to the output terminal. The control module sends a discharging control instruction to the DCDC converter 30, and upon receiving the discharging control instruction, the DCDC converter 30 performs discharge testing on the battery under test connected to the output terminal and transfers released power of the battery under test through the DC bus to the energy storage battery pack for storage.

A battery testing apparatus proposed in this embodiment includes an energy storage battery pack, a control module, a DC bus, and at least one DCDC converter. The control module sends a charging/discharging control instruction to the DCDC converter, and upon receiving the charging/discharging control instruction, the DCDC converter transfers power between the battery under test connected to the output terminal and the energy storage battery pack through the DC bus to perform charge/discharge testing on the battery under test connected to the output terminal. During charge testing on the battery under test, there is no need to obtain power from the power grid via the first-level DC bus, and during discharge testing on the battery under test, it is not necessary to feed back via a feedback route to the power grid power released from the battery under test. This eliminates the power loss attributed to the feedback route and the first-level DC bus, improving the energy utilization efficiency of the battery testing apparatus.

Figure 2:
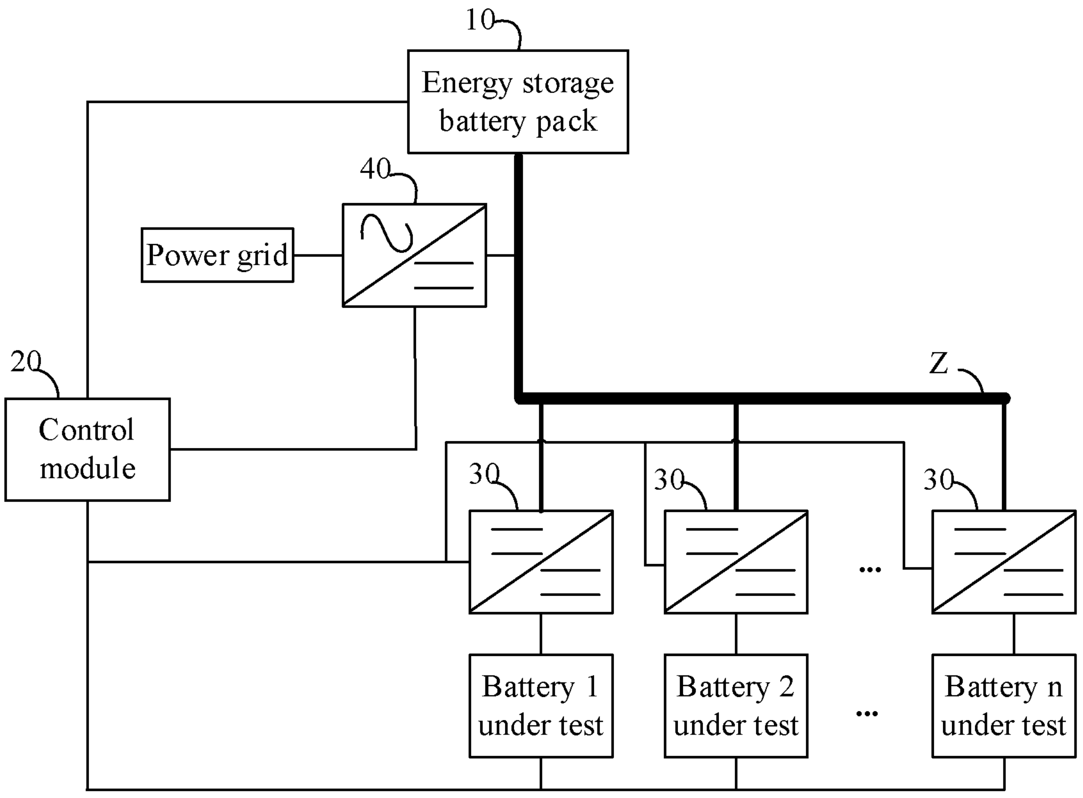
FIG. 2 is a functional module diagram of another embodiment of the battery testing apparatus according to this application.

In some embodiments, referring to FIG. 2, the battery testing apparatus further includes an ACDC converter 40. The ACDC converter 40 has an input terminal for connecting to the power grid, has an output terminal connected to the input/output terminal of the energy storage battery pack 10, and has a controlled terminal connected to the control module 20.

The control module 20 sends a power supplement control instruction to the ACDC converter 40. Upon receiving the power supplement control instruction, the ACDC converter 40 switches to an operating state to obtain power from the power grid to charge the energy storage battery pack 10.

The power supplement control instruction may be an instruction to control the ACDC converter to obtain power from the power grid to charge the energy storage battery pack. The power supplement control instruction can be sent to the ACDC converter by a tester using the control module, or be automatically sent to the ACDC converter by the control module when remaining power of the energy storage battery pack is less than a power threshold. The ACDC converter 40 may be a converter that converts AC to DC or DC to AC. The control module 20 sends a control instruction to the controlled terminal of the ACDC converter 40 to control states of the ACDC converter 40. The states of the ACDC converter 40 include an operating state and a non-operating state. The operating state may be a state in which the ACDC converter 40 is in voltage conversion; and the non-operating state may be a state in which the ACDC converter 40 is offline, shutdown, standby, or so on and cannot perform any voltage conversion.

In some implementations, the control module 20 may obtain remaining power of the energy storage battery pack 10, and when the remaining power is less than a power threshold, the control module 20 determines that the energy storage battery pack 10 has low power and needs to be charged. In this case, the control module 20 sends a power supplement control instruction to the controlled terminal of the ACDC converter 40, and upon receiving the power supplement control instruction, the ACDC converter switches to the operating state to take power from the power grid and converts AC power to DC power to supplement power for the energy storage battery pack 10.

In specific implementation, for example, under a condition that the power threshold is 70% and the control module 20 obtains that the remaining power of the energy storage battery pack 10 is 65% which is lower than the power threshold, the control module 20 determines that it is needed to supplement power for the energy storage battery pack 10 and sends the power supplement control instruction to the ACDC converter 40, and after receiving the power supplement control instruction, the ACDC converter 40 switches from the non-operating state to the operating state, and after switching to the operating state, the ACDC converter 40 converts the AC power from the power grid to DC power to charge the energy storage battery pack 10.

Due to the power loss that occurs during voltage conversion by the DCDC converter, the power level of the energy storage battery pack gradually decreases during the charge and discharge testing on the battery under test. Therefore, this embodiment proposes the battery testing apparatus including the ACDC converter. The control module sends the power supplement control instruction to the ACDC converter to make the ACDC converter switch to the operating state to obtain power from the power grid to charge the energy storage battery pack, so as to compensate for the power loss during charge and discharge testing. This improves the operation stability of the battery testing apparatus without setting up a large-capacity energy storage battery pack.

In some embodiments, with continued reference to FIG. 2, the control module 20 sends a parallel charging control instruction to the ACDC converter 40. Upon receiving the parallel charging control instruction, the ACDC converter 40 switches to the operating state to obtain power from the power grid, and together with the energy storage battery pack 10, provides power to the battery under test through the DC bus Z.

The parallel charging control instruction may be an instruction to control the ACDC converter to switch to the operating state to obtain power from the power grid and provide, in parallel with the energy storage battery pack, power to the battery under test. The parallel charging control instruction can be sent to the ACDC converter by a tester using the control module, or be automatically sent to the ACDC converter when total charging demanded power of all batteries under test is greater than total power released from the energy storage battery pack, where the total charging demanded power is predicted by the control module according to a preset charge testing process. This is not limited in this embodiment. After switching to the operating state, the ACDC converter outputs power to the DC bus together with the energy storage battery pack to enable the DCDC converter to obtain power from the DC bus to charge the battery under test.

In some implementations, for example, under a condition that the tester determines that the total charging demanded power for charge testing on all the batteries under test at a time in the future determined according to the charge testing process is greater than total power released from the energy storage battery pack, the tester sends a parallel charging instruction to the controlled terminal of the ACDC converter using the control module, and the ACDC converter switches to the operating state upon receiving the parallel charging control instruction, and provides power to the battery under test through the DC bus together with the energy storage battery pack to enable the energy storage battery pack to survive extreme charge testing conditions.

During charge testing on the battery under test, the control module sends a parallel charging control instruction to the ACDC converter, so that the ACDC converter switches to the operating state in advance and charges the battery under test through the DC bus together with the energy storage battery pack to meet charging demand under extreme charging conditions. In this way, the battery testing apparatus can still meet the charge testing demand without setting up a large-capacity energy storage battery pack, making the battery testing apparatus applicable to different scenarios while reducing the cost of the energy storage battery pack.

In some embodiments, with continued reference to FIG. 2, the control module 20 sends a power feedback control instruction to the ACDC converter 40. Upon receiving the power feedback control instruction, the ACDC converter 40 switches to the operating state to feed back to the power grid the power released from the battery under test during discharge testing.

The power feedback control instruction may be an instruction to control the ACDC converter to feed back to the power grid the power released from the battery under test. The power feedback control instruction may be sent to the ACDC converter by the tester using the control module during discharge testing on the battery under test, or may be automatically sent to the ACDC converter by the control module when total released power of all batteries under test predicted according to a preset discharge testing process is greater than an energy storage capacity of the energy storage battery pack. The energy storage capacity can be a maximum capacity of the energy storage battery pack to store power.

In one implementation, when the total power released from the battery under test is greater than the storage capacity of the energy storage battery pack, the control module determines that the energy storage battery pack cannot store the power released from the battery under test and sends a power feedback control instruction to the controlled terminal of the ACDC converter. Upon receiving the power feedback control instruction, the ACDC converter switches to the operating state and feeds the power released from the battery under test back to the power grid.

The control module in this embodiment sends the power feedback control instruction to the ACDC converter, and upon receiving the power feedback control instruction, the ACDC converter switches to the operating state and feeds the power released from the battery under test back to the power grid. This can meet the discharging demand under extreme discharging conditions and the battery testing apparatus can meet the discharge testing requirements without setting up a large-capacity energy storage battery pack, allowing the battery testing apparatus to be applicable to more test scenarios while reducing costs.

In some embodiments, with continued reference to FIG. 2, the control module 20 sends a switching-out control instruction to the ACDC converter 40. The ACDC converter 40 switches to a non-operating state upon receiving the switching-out control instruction.

The switching-out control instruction may be an instruction to control the ACDC converter to switch to a non-operating state. The switching-out control instruction may be sent by the tester to the ACDC converter using the control module or may be automatically sent by the control module to the ACDC converter when remaining power of the energy storage battery pack is greater than a power threshold, when the energy storage battery pack has survived extreme charge testing conditions, and/or when the energy storage battery pack has survived extreme discharge testing conditions.

When the ACDC converter is in the operating state, a feedback route between the power grid and the battery testing apparatus is connected, and power exchange between the power grid and the battery testing apparatus leads to high power loss. Then, in this embodiment, the control module sends the switching-out control instruction to control the ACDC converter to switch to the non-operating state to disconnect the feedback route between the power grid and the battery testing apparatus, so as to reduce the power loss and further enhance the power utilization efficiency of the battery testing apparatus.

In some embodiments, the battery capacity of the energy storage battery pack is the average demanded power for charge testing on all batteries under test.

The average demanded power can be the average demanded power of all batteries under test during the charge testing on all the batteries under test. For example, there are two batteries under test: A1 and A2, capacity of A1 is 100 AH, capacity of A2 is 80 AH, a charge testing process for A1 is: charge at 80 A for 1 hour—rest for 10 minutes—charge at 80 A for 1 hour—charge at 100 A for 1 hour, and a charge testing process for A2 is: charge at 60 A for 1 hour—rest for 10 minutes—charge at 60 A for 1 hour—charge at 60 A for 1 hour. In this case, the total demanded power is 140 AH, 140 AH, and 160 AH respectively, then the average demanded power is 150 AH, and in this case, the battery capacity of the energy storage battery pack can be set to 150 AH. On the basis of the average demanded power, a redundancy amount can be set, and the battery capacity of the energy storage battery pack is set as a sum of the average demanded power and the redundancy amount.

In some implementations, the capacity of the energy storage battery pack can be determined in advance according to the charge testing process of the battery under test. For example, the batteries under test are A1, A2, and A3, and a charge testing process is determined for A1, A2, and A3 separately. Average demanded power of the batteries under test during charge testing can be determined according to the charge testing process, and a redundancy amount can be set on the basis of the average demanded power to determine the energy storage capacity of the energy storage battery pack, so that the energy storage battery pack can meet most charge testing requirements. In case of extreme charging conditions, for example, all batteries under test are in the full power charging state and the energy storage battery pack cannot meet the power required in charge testing, the control module can send the parallel charging control instruction in advance to control the ACDC converter to switch to the operating state to obtain power from the power grid and charge the batteries under test together with the energy storage battery pack, so as to survive the extreme charging conditions. After the extreme charging conditions, the control module controls the ACDC converter to switch to the non-operating state to restore an independent operation mode of the battery testing apparatus.

In this embodiment, the battery capacity of the energy storage battery pack is set to the average demanded power of all batteries under test to reduce the cost of the energy storage battery pack while ensuring that the energy storage battery pack meets charge testing requirements of all batteries under test.

In some embodiments, the battery capacity of the energy storage battery pack is a sum of battery capacities of all the batteries under test.

In this embodiment, for example, there are two batteries under test: A1 and A2, A1 has a capacity of 100 AH, A2 has a capacity of 80 AH, and the battery capacity of the energy storage battery pack can be set to 180 AH.

In this embodiment, the battery capacity of the energy storage battery pack is set to the sum of the battery capacities of all the batteries under test, enabling the energy storage battery pack to meet the charge testing requirements of all the batteries under test.

In some embodiments, when the ACDC converter is in a non-operating state, a power feedback route between the battery testing apparatus and the power grid is in a disconnected state.

When the ACDC converter is in the non-operating state, the power feedback route between the battery testing apparatus and the power grid is disconnected. The power feedback route can be a circuit for power exchange between the power grid and the battery testing apparatus. When the power feedback route is in the disconnected state, power exchange cannot be performed between the power grid and the battery testing apparatus.

In this embodiment, when the ACDC converter is in the non-operating state, the power feedback route between the battery testing apparatus and the power grid is in the disconnected state, which can prevent the power grid and the battery testing apparatus from exchanging power through the power feedback route, reducing loss in the power transmission process.

In some embodiments, a power feedback route between the battery testing apparatus and the power grid is in a connected state when the ACDC converter is in an operating state.

When the ACDC converter is in the operating state, the power feedback route between the battery testing apparatus and the power grid is connected, allowing the ACDC converter to transfer power between the power grid and the battery testing apparatus.

In this embodiment, when the ACDC converter is in the operating state, the power feedback route between the battery testing apparatus and the power grid is in the connected state, allowing power exchange between the battery testing apparatus and the power grid. This enables the battery testing apparatus to be applicable to different charge testing conditions and discharge testing conditions and broadens the use scenarios of the battery testing apparatus.

In some embodiments, the control module 20 is further configured to obtain remaining power of the energy storage battery pack 10, and send a power supplement control instruction to the ACDC converter 40 when the remaining power is less than or equal to a first preset power threshold.

The first preset power threshold may be a predetermined power value. When the remaining power of the energy storage battery pack 10 is less than the first preset power threshold, it is determined that the energy storage battery pack 10 has low power and needs to be charged, and in this case, the control module 20 sends a power supplement control instruction to the ACDC converter 40.

In this embodiment, the ACDC converter 40 takes power from the power grid, and when the power of the energy storage battery pack 10 is reduced to the first preset power threshold due to power loss, the control module 20 sends the power supplement control instruction to the ACDC converter to control the ACDC converter 40 to take power from the power grid to supplement the power of the energy storage battery pack 10.

In specific implementation, for example, the first preset power threshold is 70%, the control module 20 obtains that the remaining power of the energy storage battery pack 10 is 65%, which is less than the first preset power threshold, the control module 20 determines that it is needed to supplement power for the energy storage battery pack 10, and sends the power supplement control instruction to the ACDC converter 40, and after receiving the power supplement control instruction, the ACDC converter 40 switches from the non-operating state to the operating state and takes power from the power grid to supplement power for the energy storage battery pack.

In this embodiment, when monitoring that the remaining power of the energy storage battery pack is less than the first preset power threshold, the control module sends the power supplement control instruction to the ACDC converter, such that the ACDC converter switches to the operating state to obtain power from the power grid to charge the energy storage battery pack, so as to compensate for the power loss during the charge and discharge testing process. This improves the operation stability of the battery testing apparatus without setting up a large-capacity energy storage battery pack.

In some embodiments, the control module 20 is further configured to predict total charging demanded power of all batteries under test according to a charge testing process of each battery under test, and when the total charging demanded power is greater than total power released from the energy storage battery pack, send a parallel charging instruction to the ACDC converter 40.

The total charging demanded power of all the batteries under test predicted according to the charge testing process may be the total power required to charge all the batteries under test for a given period in the future according to the charge process. The total released power can be the total power that can be released by the energy storage battery pack at a given period in the future. As the charge testing process of each battery under test is predetermined, the demanded power of each battery under test in a given period in the future can be predicted based on the charge testing process, and a sum of the demanded power of all the batteries under test is the total charging demanded power. The parallel charging instruction can be an instruction to control the ACDC converter to switch to the operating state to obtain power from the power grid.

In one example, when the total charging demanded power is greater than the total released power, the control module determines that the energy storage battery pack cannot meet the charging demand of the battery under test at a given period in the future, and sends the parallel charging instruction to the ACDC converter to make the ACDC converter switch to the operating state in advance. After switching to the operating state, the ACDC converter outputs power to the DC bus together with the energy storage battery pack to enable the DCDC converter to obtain power from the DC bus to charge the battery under test.

In charge testing on the batteries under test, if multiple batteries under test are in the full power charging state, the total charging demanded power of the batteries under test may be greater than the total power released from the energy storage battery pack, resulting in the battery testing apparatus being unable to meet charge testing requirements of the batteries under test. The control module in this embodiment predicts the total charging demanded power of all the batteries under test at a given period in the future according to the charge testing process corresponding to each battery under test. When the total charging demanded power is greater than the total power released from the energy storage battery pack, the control module sends the parallel charging instruction to the ACDC converter, so that the ACDC converter switches to the operating state in advance and charges the battery under test together with the energy storage battery pack through the DC bus to meet the charging demand under extreme charging conditions, that is, the battery testing apparatus can still meet the charging demand without setting up a large-capacity energy storage battery pack. This enables the battery testing apparatus to be applicable to different scenarios while reducing the cost of energy storage battery pack.

In some embodiments, the control module 20 is further configured to predict the total released power of all the batteries under test based on the discharge testing process of each battery under test, and send a power feedback control instruction to the ACDC converter 40 when the total released power is greater than the energy storage capacity of the energy storage battery pack 10.

Predicting the total released power of each battery under test according to the discharge testing process of each battery under test may be determining released power of each battery under test according to the discharge testing process at a given period in the future. A sum of the released power of all the batteries under test is the total released power. The energy storage capacity can be a maximum capacity of the energy storage battery pack to store power.

In one implementation, when the total released power is greater than the storage capacity, the control module determines that the energy storage battery pack cannot store the power released from the battery under test at a given period in the future, sends a power feedback control instruction to the ACDC converter to control the ACDC converter to switch to the operating state and feed back via the feedback route to the power grid power in the total released power that cannot be stored by the energy storage battery pack.

In the discharge testing on the batteries under test, if multiple batteries under test are in the full power discharge state, the energy storage battery pack may not be able to store the total released power of the batteries under test, resulting in the battery testing apparatus being unable to meet the discharge testing requirements of the batteries under test. The control module in this embodiment predicts the total released electric energy of all the batteries under test at a given period in the future according to the corresponding discharge testing process of each battery under test, and controls the ACDC converter to switch to the operating state when the total released power is greater than the energy storage capacity of the energy storage battery pack, so as to feed back via the feedback route to the power grid the power that cannot be stored by the energy storage battery pack to meet the discharge testing requirements under extreme discharging conditions. In this way, the battery testing apparatus can still meet the discharge testing requirements without setting up a large-capacity energy storage battery pack, allowing the battery testing apparatus to be applicable to more test scenarios while reducing costs.

To achieve the above purpose, this application further proposes a battery testing device. The battery testing device includes the battery testing apparatus as described above. For a specific structure of this battery testing device, refer to the above embodiments. By incorporating all the technical solutions from all the above embodiments, this device inherits at least all the beneficial effects provided by the technical solutions of the above embodiments, which are not repeated herein.

The foregoing descriptions are merely some embodiments of this application, but are not intended to limit the patent scope of this application. Any equivalent structural transformations made by using the content of the specification and drawings under the concept of this application or direct or indirect application of the content of the specification and drawings to other related technical fields should fall within the patent protection scope of this application.

What is claimed is:

1. A battery testing apparatus, comprising:

an energy storage battery pack, the energy storage battery pack having an input/output terminal connected to a DC bus;

a DCDC converter, having an input terminal connected to the DC bus and having an output terminal configured to be connected to a battery under test;

an ACDC converter, the ACDC converter having an input terminal for connecting to a power grid to directly receive AC power from the power grid, an output terminal connected to the input/output terminal of the energy storage battery pack, and a controlled terminal connected to a control module; and the control module, connected to the energy storage battery pack, the DCDC converter, and the ACDC converter;

wherein:

the control module is configured to send a charging/discharging control instruction to the DCDC converter;

the DCDC converter is configured to transfer power between the battery under test connected to the output terminal and the energy storage battery pack through the DC bus upon receiving the charging/discharging control instruction, to perform charge/discharge testing on the battery under test connected to the output terminal; and the control module is further configured to send a power supplement control instruction to the ACDC converter, and the ACDC converter is configured to, upon receiving the power supplement control instruction, switch to an operating state to obtain the AC power from the power grid to charge the energy storage battery pack.

2. The battery testing apparatus according to claim 1, wherein:

the control module is further configured to send a parallel charging control instruction to the ACDC converter; and the ACDC converter is further configured to: upon receiving the parallel charging control instruction, switch to an operating state to obtain power from the power grid, so as to provide power to the battery under test for charge testing through the DC bus together with the energy storage battery pack.

3. The battery testing apparatus according to claim 2, wherein the control module is further configured to predict total charging demanded power of all batteries under test according to a charge testing process of each battery under test, and in response to the total charging demanded power being greater than total power released from the energy storage battery pack, send the parallel charging instruction to the ACDC converter.

4. The battery testing apparatus according to claim 1, wherein:

the control module is further configured to send a power feedback control instruction to the ACDC converter; and the ACDC converter is further configured to switch to an operating state upon receiving the power feedback control instruction, to feed back to the power grid the power released from the battery under test during discharge testing.

5. The battery testing apparatus according to claim 4, wherein the control module is further configured to predict total released power of all batteries under test according to a discharge testing process of each battery under test, and in response to the total released power being greater than an energy storage capacity of the energy storage battery pack, send the power feedback control instruction to the ACDC converter.

6. The battery testing apparatus according to claim 1, wherein:

the control module is further configured to send a switching-out control instruction to the ACDC converter; and the ACDC converter is further configured to switch to a non-operating state upon receiving the switching-out control instruction.

7. The battery testing apparatus according to claim 1, wherein a power feedback route between the battery testing apparatus and the power grid is in a disconnected state when the ACDC converter is in a non-operating state.

8. The battery testing apparatus according to claim 1, wherein a power feedback route between the battery testing apparatus and the power grid is in a connected state when the ACDC converter is in an operating state.

9. The battery testing apparatus according to claim 1, wherein the control module is further configured to obtain remaining power of the energy storage battery pack, and in response to the remaining power being less than or equal to a first preset power threshold, send the power supplement control instruction to the ACDC converter.

10. The battery testing apparatus according to claim 1, wherein battery capacity of the energy storage battery pack is average demanded power for charge testing on all batteries under test.

11. The battery testing apparatus according to claim 1, wherein battery capacity of the energy storage battery pack is a sum of battery capacities of all batteries under test.

12. A battery testing device, comprising the battery testing apparatus according to claim 1.

* * * * *